United States Patent [19]

Beals

[11] Patent Number: 4,608,636
[45] Date of Patent: Aug. 26, 1986

[54] SLEW RATE FILTER FOR LOGGING CABLE SIGNAL PICK-OFF

[75] Inventor: Richard A. Beals, Houston, Tex.
[73] Assignee: Halliburton Company, Duncan, Okla.
[21] Appl. No.: 582,973
[22] Filed: Feb. 23, 1984
[51] Int. Cl.⁴ .................... G06F 15/20; G01V 1/00
[52] U.S. Cl. .................... 364/422; 367/25; 367/911; 324/351
[58] Field of Search .................... 364/422; 367/25–35, 367/911–912; 324/323–324, 333, 338, 346, 351–352, 355, 366, 368

[56] References Cited

U.S. PATENT DOCUMENTS

| | | | |
|---|---|---|---|
| 2,771,960 | 11/1956 | Smith | 367/911 X |
| 2,784,796 | 3/1957 | Overton, Jr. | 367/911 X |
| 4,032,780 | 6/1977 | Paap et al. | 364/422 X |
| 4,122,387 | 10/1978 | Ajam et al. | 364/422 X |
| 4,310,887 | 1/1982 | Suau | 364/422 |
| 4,314,338 | 2/1982 | Suau et al. | 364/422 |
| 4,353,122 | 10/1982 | Cubberly, Jr. | 367/25 |
| 4,454,756 | 6/1984 | Sharp et al. | 364/422 X |
| 4,523,148 | 6/1985 | Maciejewski | 324/351 |
| 4,541,275 | 9/1985 | Kerzner | 364/422 X |
| 4,543,648 | 9/1985 | Hsu | 367/29 |

Primary Examiner—Gary V. Harkcom
Attorney, Agent, or Firm—W. J. Beard

[57] ABSTRACT

A signal amplifier system for use in a downhole logging system wherein a signal transmitter is mounted in a sonde suspended on a logging cable thousands of feet into a borehole. Variable slew rate amplifiers connected to a differential amplifier are set forth. Preferably, programmable amplifiers having a gain determined by a driving current are used. Two such amplifiers are connected to the input signal, and they are driven by different current sources. The output signals are summed at a differential amplifier. Through the use of different slew rates, the incoming signal is amplified by the two programmable amplifiers and the outputs of the two amplifiers are then subtracted from one another. Signals which pass equally through both programmable amplifiers (due to slew rates which do not cause limiting) thus are subtracted from each other. Faster rise time signal pulses are amplified by different gains; the differential of the two amplified signals (having differing gain rates) enables noise reduction at the differential amplifier output. The differential output signal is reduced in noise amplitude.

9 Claims, 2 Drawing Figures

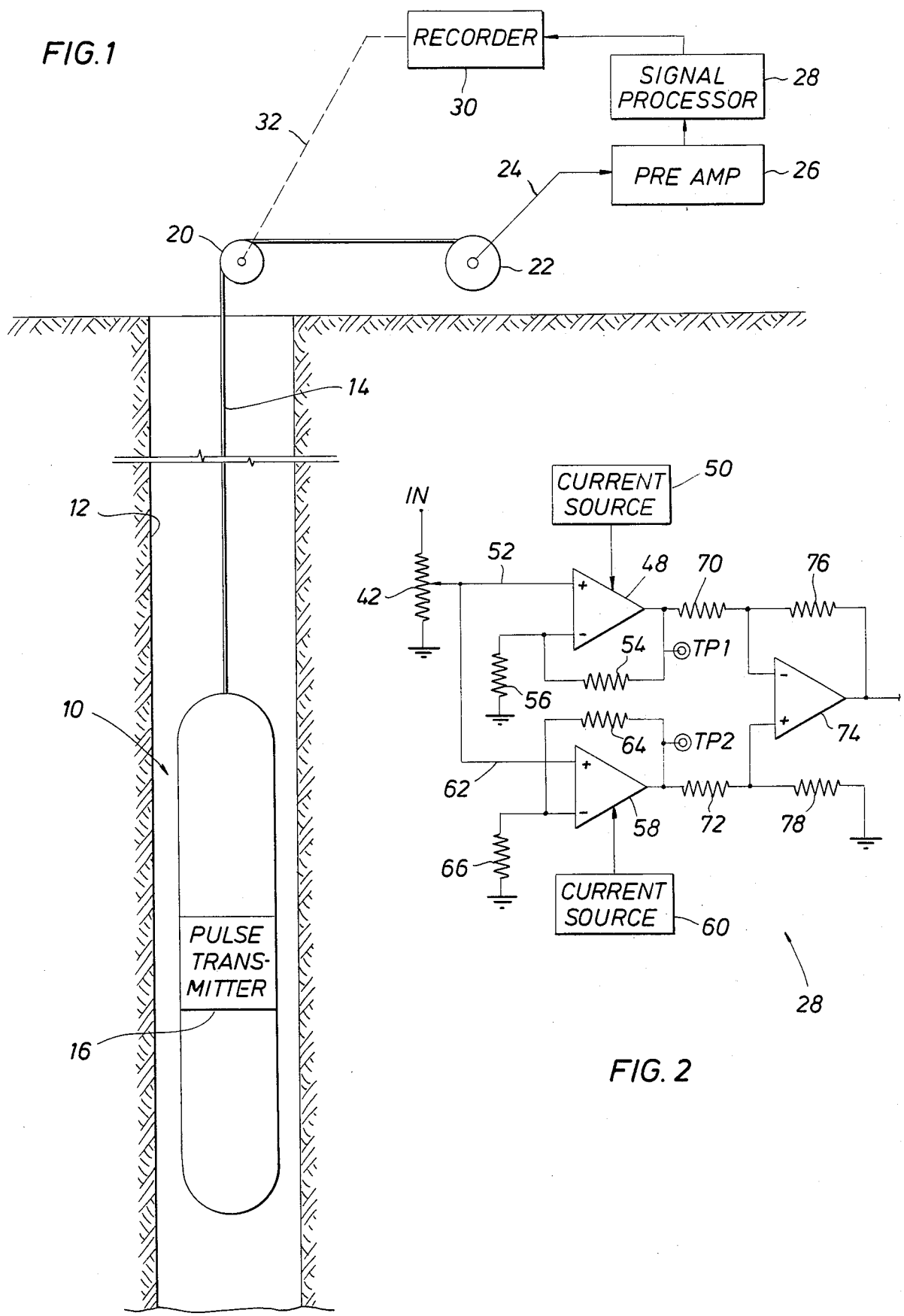

SLEW RATE FILTER FOR LOGGING CABLE SIGNAL PICK-OFF

BACKGROUND OF THE DISCLOSURE

This apparatus is directed an amplifier system for use forming output signal of a downhole logging tool. A logging tool forms a signal which is transmitted from a fluid tight sonde supported on an armored logging cable. The logging cable includes one or more conductors in the logging cable. Typically, the signal of interest is transmitted up the logging cable and is obsured by noise picked up in transmission from the sonde to the signal processing equipment at the surface. For instance, a typical logging cable will include a power conductor for providing electrical power to the sonde. Logging cables are quite long, easily as long as 25,000 feet. The noise picked up by a conductor for the signal of interest is substantial. Frequently the sonde operational power and the signals from the sonde share the same two conductors.

Typically, a sonde is lowered to the bottom of a well and then is retrieved from the well pulling the logging cable and sonde up the well as logging is continued. Clearly, there are multiple sources of noise imposed on the signal conductor in a logging cable. Additional noise may occur because a portion of the logging cable is coiled on a spool or reel which tends to act as an inductor, thereby increasing the noise level on the signal conductor because the self inductance of the coiled logging cable adds a signal component into the logging cable. This apparatus is directed to an amplifier system adapted to be located at the surface and connected to the signal conductor for amplification of the signal (with noise) to thereby reduce the relative amplitude of the noise imposed on the signal.

SUMMARY OF THE INVENTION

With the foregoing in view, the present apparatus is directed to a filter and amplifier system adapted to be connected to a signal conductor in a logging cable, the apparatus providig amplification in such a manner as to reduce noise on the signal. In particular, this apparatus is summarized as incorporating first and second input amplifiers. Both are provided with the input signal with noise imposed on the signal. Both amplifiers are driven by current sources which cause the amplifiers to be limited at different slew rates. The two amplified inputs are then provided to a differential amplifier which forms an output signal having reduced noise content. The current sources thereby vary the "gain" of the respective amplifiers differently. This particularly enables the filter system to separate digital data pulses from noise having frequency components which are close to but lower than the frequency of the signal of interest. This particularly has an advantage over high Q notch filters which inevitably ring or otherwise stretch pulse inputs.

BRIEF DESCRIPTION OF THE DRAWINGS

So that the manner in which the above recited features, advantages and objects of the present invention are attained and can be understood in detail, more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments:

FIG. 1 is a system view showing a downhole logging tool which includes a pulse transmitter which transmits data of interest in the form of pulses along a logging cable having a signal conductor therein and further showing the deployment of the logging cable to the surface where it is connected to signal processing and recorder equipment; and FIG. 2 is a filter system formed of multiple amplifiers in accordance with teachings of this disclosure and which system provides an amplified output signal with reduced relative noise content.

DETAILED DESCRIPTION OF THE PREFERRED EMBODIMENT

Attention is first directed to FIG. 1 of the drawings where a sonde 10 is suspended in a borehol 12 on a logging cable 14. The sonde includes a device for conducting downhole measurements of a type and form which output is encoded in an output pulse train. The signal is a procession of pulses placed on a conductor in the logging cable 14. The sonde incorporates a pulse transmitter 16. The pulse transmitter forms the pulses on the signal conductor in the logging cable. As will be understood, the precise nature of the transducer and mechanism in the sonde which obtains the information which is encoded in the pulse train is not critical to this disclosure. In fact, a variety of detectors can be incorporated with this device.

The logging cable extends to a sheave 20 at the surface. The cable is spooled on a drum or reel 22. The conductors in the logging cable extend by means of a conductor 24 to a preamplifier 26. This is input to a signal conditioner 28. That in turn connects with a signal recorder 30. The signal is recorded oposite the depth of the sonde 10 in the borehole by means of a depth measuring apparatus 32 connected to the sheave 20 and which forms an input signal for the recorder 30. Thus, the signal is recordd as a function of depth.

Attention is next directed to FIG. 2 of the drawings. There, the signal processor 28 is shown in greater detail. It is more aptly characterized as an active filter incorporating amplifier means, all as will be set forth in detail. The input signal from the conductor is applied across a grounded resistor 42. The input signal is then provided to the first of two identical differential amplifiers. This amplifier is identified by the numeral 48 while the second amplifier is identified by the numeral 58. Both amplifiers are identical in construction, and one suitable brand of manufacture is National Semi-Conductor, and suitable amplifiers are selected from the LM146 series. Both amplifiers are connected with current sources which control their slew rate. The current sources are also from the same maker, preferably selected from the LM134 series. Both amplifiers thus have a controllable "gain" for the differential signal, the gain being in part a function of the input current level. As the input current level is increased, the gain is increased. Thus, the first amplifier 48 includes a current source 50. The second amplifier includes a current source 60. Both current sources function in the manner described. Both current sources 50 and 60 are provided with the input signal. The current sources are adjusted so that one causes a different amplifier slew rate contrasted with the other amplifier. That is, the slew rate is different for the two amplifiers 48 and 58.

The input signal is provided on an input conductor 52 for the first amplifier and a parallel input conductor 62 for the second amplifier. The first amplifier is provided with a feedback resistor 54 which is similar to a feedback resistor 64 for the second aplifier. Both amplifiers are provided with differential inputs. A suitable grounding resistor is shown at 56 for the first amplifier and a similar grounding resistor 66 is incorporated for the second amplifier. The two amplifiers thus provide an amplified differential output signal. Assuming that they are operated at similar gain levels, they will provided output signals which are identical, or at least nearly so, and which if subtracted, would provide substantially a null signal. However, one of the two amplifiers is preferably operated with a higher slew rate than the other amplifier. The benefit of this difference in slew rate will be noted hereinafter.

The first amplifier output is provided through a resistor 70 and the second is provided through a resistor 72. Both resistors are input to a differential amplifier 74. It is connected with a suitable feedback resistor 76. For convenience, the amplifier 74 can readily be identical to the other two amplifers. There is no need to operate this amplifier at an adjustable slew rate. It is provided with the two input signals, and one of the two is referenced to ground through a grounded resistor 78. The two input signals are subtacted from one another and they are input to the differential amplifier 74. That amplifier forms an amplified signal which is output for use in the recording system 30 previously mentioned.

Consider the device described in FIG. 2 in operation. Assume that it is provided with an input signal which is obscured with AC noise. The noise is superimposed over the pulsed train of interest. As this signal is input to the two amplifiers, they will be operated to form similar output signals which are subtracted from one another. However, if they are provided with current drivers which have different slew rates, the gain of the two amplifiers will be different in dynamic circumstances. As the gain is made different, the amplification levels of the two amplifiers 48 and 58 become different. Assume for purposes of further description that the amplifier 48 has a limited slew rate (with respect to amplifier 58). Keeping in view the fact that both amplifiers simply amplify the signal applied to them, both then provided an output signal which includes the signal of interest and the superimposed noise. However, in one of the two amplifiers, because the slew rate is less, the gain is less and therefore the (higher slew rate) signal is amplified by less. If both outputs are the provided to the differential amplifier and subtracted, the superimposed noise on top of the pulse train of interest will be reduced in relative amplitude. Restated, (slower slew rate) noise in the signal is reduced in relative amplitude.

As shown in FIG. 2, the amplifiers 48 and 58 (being preferably identical as disclosed hereinabove) each have two inputs. One is labeled as the positive input where the signal is input over the conductors 52 and 62, respectively. The signals are input to the positive terminals while the negative terminals are utilized for connection with grounded resistors 56 and 66, respectively. This provides a reference input to each of the two amplifiers where the variable signals input to the positive terminals are amplified based on the difference in signal level above the reference values established from the resistors 56 and 66. Moreover, the feedback loop resistors 54 and 64 are shown connected to input at the negative terminals of the differential amplifiers.

The differential amplifier 74 is also equipped with positive and negative input terminals as illustrated in FIG. 2. These inputs are connected with the two driving amplifiers 48 and 58 so that the two input signals can be subtracted from another as described above. Conveniently, one of the input signals is connected to one of the input terminals on the amplifier 74 while the other input is connected to the input terminal of opposite polarity to thereby obtain subtraction of the two input signals.

In operation, this devide operates dynamically to reduce the relative noise amplitude. The noise amplitude is reduced to thereby enable the signal to be passed for additional data processing or recording as appropriate. Particularly, where the noise slew rate is less than the signal slew rate, the difference in amplifier slew rates enables the two amplifiers to form intermediate signals differentially subtracted and thereby obtain an output signal substantially reduced in noise content. Significant improvement in the signal to noise ratio can be obtained typically in the range of three DB to perhaps as much as nine DB.

The foregoing is directed to the preferred embodiment, the scope is determined by the claims which follow.

What is claimed is:

1. In a well logging system including a fluid tight body member or sonde sized and adapted for passage in a well borehole and supported downhole on an armored well logging cable and said sonde a pulse source connected to a pulse transmitting conductor in said logging cable, a surface located data output system connected to said conductor and comprising:
    (a) first and second amplifier means of similar construction, said first and second amplifier means both being operably connected to said transmitting conductor in said logging cable to receive a signal from the logging cable wherein electrical noise obscures the signal on the cable conductor;
    (b) said first and second amplifier means being operable at adjustable slew rates under control of slew rate control currents provided to said first and second amplifier means, and wherein first and second current sources are respectively connected to said first and second amplifier means to provide slew rate control currents thereto; and
    (c) summing means connected to the outputs of said first and second amplifier means, said summing means summing the output signals provided by said first and second amplifier means to form a differential signal therefrom, wherein said differential signal includes a signal of interest with reduced noise as a function of changes in the slew rate of said first and second amplifier means.

2. The data output system of claim 1 including a feedback loop around said first amplifier means.

3. The data output system of claim 1 including a feedback loop around said second amplifier means.

4. The data output system of claim 1 including a feedback loop around a third amplifier means comprising said summing means.

5. The data output system of claim 1 wherein said summing means comprises a differential amplifier means having a feedback loop connected therearound and two inputs wherein said first and second amplifier means are connected to said inputs.

6. The data output system of claim 5 wherein said first and second amplifier means are programmable gain amplifiers, and including series resistors connected between said programmable amplifiers to said inputs for said summing means.

7. The data output system of claim 6 including grounded reference resistor means connected to said first and second amplifier means.

8. The data output system of claim 7 including grounded reference resistor means connected to said differential amplifier means.

9. The data output system of claim 1 wherein said first and second amplifier means are identical.

* * * * *